US012787203B2

(12) United States Patent
Schonhardt et al.

(10) Patent No.: US 12,787,203 B2
(45) Date of Patent: Nov. 3, 2026

(54) IPx9-COMPATIBLE AUTOMATION FIELD DEVICE WITH RECESSED FRONT FILM

(71) Applicant: Endress+Hauser SE+Co. KG, Maulburg (DE)

(72) Inventors: Raphael Schonhardt, Rheinfelden (DE); Michael Lais, Schönau im Schwarzwald (DE); Vitogiuseppe Di Cosola, Hartheim (DE); Stefan Rauch, Wehr (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 275 days.

(21) Appl. No.: 18/688,161

(22) PCT Filed: Jul. 27, 2022

(86) PCT No.: PCT/EP2022/071052
§ 371 (c)(1),
(2) Date: Feb. 29, 2024

(87) PCT Pub. No.: WO2023/030772
PCT Pub. Date: Mar. 9, 2023

(65) Prior Publication Data

US 2024/0397654 A1 Nov. 28, 2024

(30) Foreign Application Priority Data

Aug. 31, 2021 (DE) ..................... 10 2021 122 570.1

(51) Int. Cl.
*H05K 7/14* (2006.01)
*H05K 5/00* (2006.01)

(52) U.S. Cl.
CPC ......... *H05K 7/1462* (2013.01); *H05K 5/0018* (2022.08)

(58) Field of Classification Search
CPC .. H05K 7/1462; H05K 5/0018; H05K 7/1478; H05K 7/1472; H05K 7/2039;
(Continued)

(56) References Cited

U.S. PATENT DOCUMENTS 9,862,587 B2 * 1/2018 Doblinger ................. B67C 3/22

FOREIGN PATENT DOCUMENTS

DE 19819287 A1 11/1998
DE 102010039357 A1 2/2012
(Continued)

OTHER PUBLICATIONS

Hans Turck GMBH & Co. KG, Übersicht HMI/PLC-Bediengeräteserie TX, Jan. 2021, www.turck.com, 36 pp.
(Continued)

*Primary Examiner* — Brandi N Hopkins
(74) *Attorney, Agent, or Firm* — Gil M. Repa; Endress+Hauser (USA) Holding, Inc.

(57) ABSTRACT

An IPx9-compatible automation field device includes: a metallic field device housing that encloses an interior and includes an integrated recess for accommodating a front film; a control and/or display element arranged in the area of the recess in the interior of the field device housing; the front film applied to the field device housing, the front film being introduced into the recess integrated into the field device housing.

7 Claims, 2 Drawing Sheets

(58) Field of Classification Search

CPC .. H05K 5/0204; H05K 7/14322; H05K 5/069; H05K 7/14324; H05K 5/0069; H05K 1/02; H05K 5/0217; H05K 7/1479; A47J 31/3676; A47J 31/441; G01D 11/245; H01R 9/2675; H01R 12/75; H05B 1/023; G05B 19/4185; G05B 19/042; G01F 1/586; G01L 11/00; G01R 27/2611; D06F 39/12

See application file for complete search history.

(56) References Cited

FOREIGN PATENT DOCUMENTS

| | | | | |
|---|---|---|---|---|
| DE | 102013111174 A1 | | 4/2015 | |
| DE | 102020104039 A1 | | 8/2021 | |
| EP | 2639943 B1 | | 2/2015 | |
| WO | WO-2021008809 A1 | * | 1/2021 | ........... H05K 7/1462 |

OTHER PUBLICATIONS

Hans Turck GMBH & Co. KG, TX700 HMI / PLC Serie 15" Display für F&B—Codesys V3 PLC mit Target & Web Visu Hochwertiges Metallgehäuse und Glas Front mit kapazitivem Touch TX715FB-P3CV01, www.turck.com, 6 pp.

Hans Turck GMBH & Co. KG, TX700FB HMI/PLC-Serie für die Lebensmittelindustrie, Nov. 2020, www.turck.com, 36 pp.

Exor International S.P.A., eTOP507MFB Tech-Note HMI 7" TFT, Pcap Touch Hygienic design, IP69, ptn0524 Version 1.6, exorint.com, 2015, 2 pp.

* cited by examiner

IPx9-COMPATIBLE AUTOMATION FIELD DEVICE WITH RECESSED FRONT FILM

CROSS-REFERENCE TO RELATED APPLICATIONS

The present application is related to and claims the priority benefit of DPMA Patent Application No. 10 2021 122 570.1, filed on Aug. 31, 2021, and International Patent Application No. PCT/EP2022/071052, filed Jul. 27, 2022, the entire contents of which are incorporated herein by reference.

TECHNICAL FIELD

Background

Field devices that are used in industrial installations are known from the prior art. Field devices are often used in process automation engineering, as well as in manufacturing automation engineering. In principle, all devices which are process-oriented and which supply or process process-relevant information are referred to as field devices. Field devices are thus used for detecting and/or influencing process variables. Measuring devices, or sensors, are used for detecting process variables. These are used, for example, for pressure and temperature measurement, conductivity measurement, flow measurement, etc., and detect the corresponding process variables of pressure, temperature, conductivity, pH value, fill-level, flow, etc. Actuator systems are used for influencing process variables. These are, for example, pumps or valves that can influence the flow of a fluid in a pipe or the fill-level in a tank. In addition to the aforementioned measuring devices and actuators, field devices are also understood to include remote I/O's, radio adapters, or, generally, devices that are arranged at the field level.

A multitude of such field devices are produced and marketed by the Endress+Hauser group.

In hygienic processes, particularly high demands are placed on their processing and/or cleanliness. Examples of such hygienic processes are applications in the food industry, where there is a risk that deposits and/or impurities can impair the shelf-life and/or lead to harmful contamination of food.

In order to meet these requirements, the housings of the field devices are specially designed. For example, they are manufactured from a metallic material, such as 316L stainless steel, and/or designed in such a way that there are as few places as possible to which deposits and/or impurities can adhere.

In order that the field devices can be cleaned from the outside, they must be designed as watertight devices. For this purpose, the International Electrotechnical Commission (IEC) has introduced IP ratings (international protection codes), which classify electrical devices and indicate the environmental conditions for which they are suitable. One type of protection is class IPx9, which corresponds to the ability to maintain the operation of the device after it has been exposed to a direct high-pressure water or steam jet for cleaning.

In order to meet this requirement, a viewing panel is now introduced into the field device housing, the surface of which is substantially flush with the surface of the field device housing, in the area where the viewing panel is inserted. However, due to manufacturing tolerances, it cannot be ruled out that a circumferential gap will arise between the housing and the viewing panel. In order to prevent dirt and contamination from accumulating, the gap is subsequently protected with a sealing material. A disadvantage of this, however, is that such sealing materials tend to loosen or become damaged in IPx9 applications. In addition, such viewing panels must be firmly anchored in the interior of the field device, since pressure from the impacting high-pressure water or steam jet pushes them inwards, thereby relieving the pressure on a seal and causing a leak.

SUMMARY

The invention is therefore based upon the object of proposing an automation field device that can be cleaned using a high-pressure water or steam jet.

The object is achieved by the IPx9-compatible automation field device according to the present disclosure.

The IPx9-compatible automation field device according to the invention comprises at least:

- a preferably metallic field device housing that encloses an interior and includes an integrated recess for accommodating a front film;
- a control and/or display element (19) arranged in the area of the recess in the interior of the field device housing;
- a front film applied to the field device housing, wherein the front film is introduced into the recess integrated into the field device housing.

According to the invention, an automation field device is proposed in which a front film is introduced into a recess or depression of the field device housing in such a way that a high-pressure water or steam jet cannot affect or corrode a rear side of the front film and loosen the front film.

An advantageous embodiment of the automation field device according to the invention provides that the recess be designed in such a way that a depth of the recess corresponds to at least one material thickness of the front film.

A further advantageous embodiment of the automation field device according to the invention provides that the recess be designed and coordinated with the front film in such a way that a circumferential gap is formed around the front film introduced into the recess. In particular, the embodiment can provide that the circumferential gap have a maximum width of 0.2 mm, in particular 0.15 mm.

A further advantageous embodiment of the automation field device according to the invention provides that the recess be produced by means of an embossing die during the manufacture of the field device housing.

A further advantageous embodiment of the automation field device according to the invention provides that the front film be printed on the rear side.

BRIEF DESCRIPTION OF THE DRAWINGS

The present disclosure is explained in more detail on the basis of the following drawings. In the figures.

DETAILED DESCRIPTION

Figure 1:
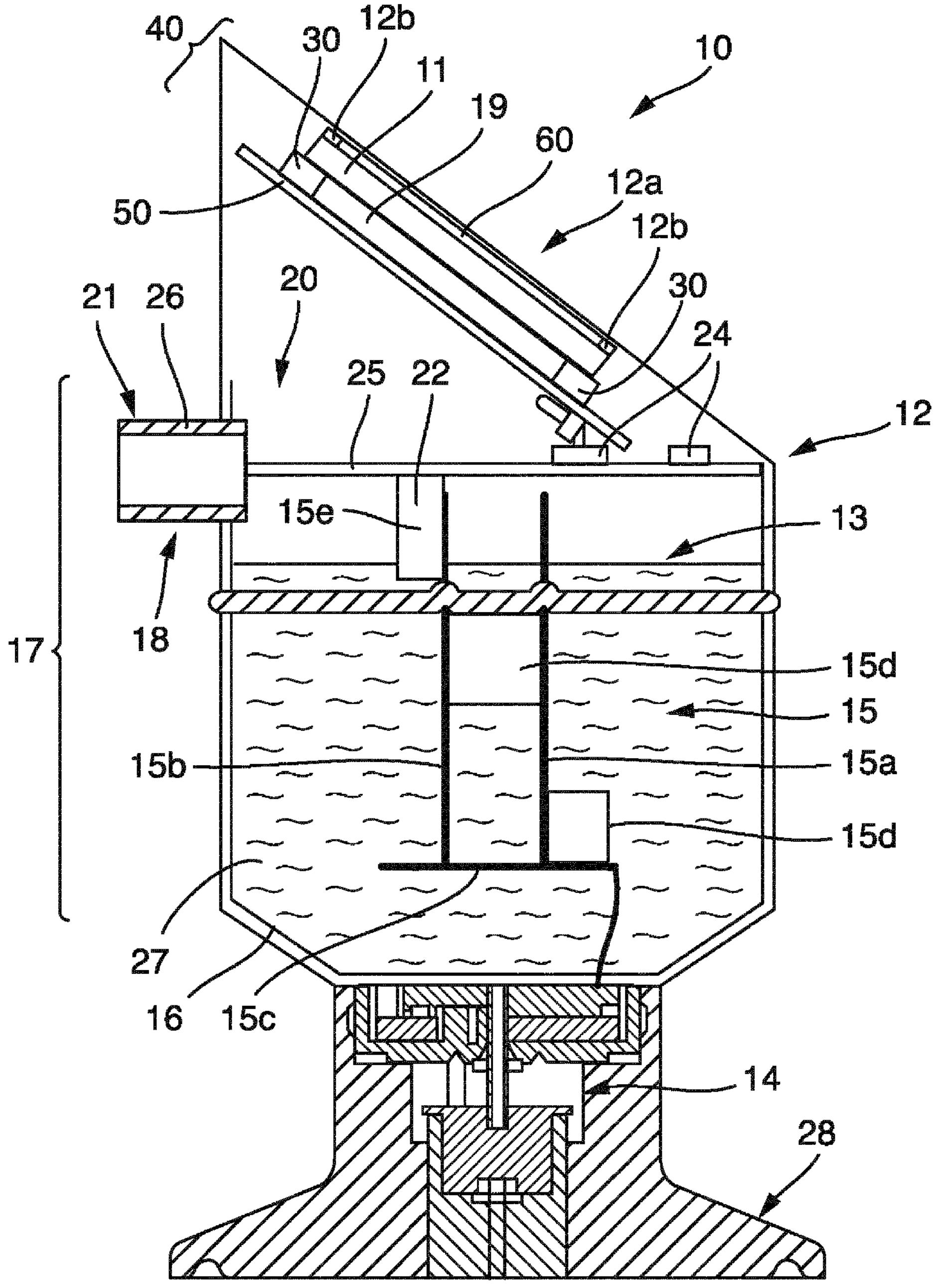
FIG. 1 shows a schematic sectional view through an IPx9-compatible automation field device which is designed for use in hygienic applications.

FIG. 1 shows a schematic sectional view through an automation field device 10. The field device 10 comprises a field device housing 12 that encloses an interior 13. The field device housing can be a metallic or a plastic housing that is manufactured, for example, by deep-drawing. In particular, it can be a stainless-steel housing. The field device housing 12 can have an, at least sectionally, rotationally symmetrical area 17 into which the field contact plug 21 is to be integrated or is integrated. The field device 10 further comprises a sensor assembly, arranged at the end of the field device housing 12, having a sensor and/or actuator element 14 for setting and/or detecting a process variable and a process connector 28. The process connector 28 can be a threaded design or a screwable or clampable flange.

In the present embodiment, the sensor and/or actuator element 14 comprises a fill-level sensor element for detecting a fill-level as a process variable. Nevertheless, the invention is not limited to the type or specific design of the sensor and/or actuator element as a fill-level sensor element, but can in principle be transferred to any other sensor or actuator principle.

An electronic circuit 15, which is introduced into an interior 13 of the field device housing and is designed to operate the sensor and/or actuator element 14, serves to provide and/or process a sensor signal and/or actuator signal.

In the present embodiment, the electronic circuit has three printed circuit boards, of which two printed circuit boards 15*a* and 15*b* are arranged in the longitudinal direction relative to the housing, and one printed circuit board 15*c* is arranged in the transverse direction relative to the housing. The invention is thereby independent of the number of printed circuit boards that are arranged in the longitudinal direction and/or transverse direction relative to the housing. For example, only one or three printed circuit boards can also be arranged in the longitudinal direction. The printed circuit boards 15*a*, 15*b*, 15*c* are plugged into one another via corresponding plug connectors and mating plug connectors 15*d*, and are thus electrically contacted. Plug connectors and mating plug connectors can be designed both as rigid and as flexible connectors. Plug and mating plug connectors can also be interchanged.

The electronic circuit further comprises interface electronics 20 having at least one first printed circuit board 25 with a field contact plug 21, which is arranged in a longitudinal axis of the printed circuit board 25 on a printed circuit board edge and is soldered thereto. The field contact plug 21 transmits data, in particular measured values, and/or energy from the field device 10 to an external unit—for example, a superordinate unit or another field device.

The field contact plug 21 can in particular be a circular plug connector—for example, an M12 circular plug connector. However, it can also be another common plug connector that is suitable for transmitting data and/or energy. For example, it can also be an Ethernet plug. Furthermore, the field contact plug 21 can also be a cable gland through which a line for electrical contacting is guided into the interior of the field device.

The interface electronics 20 further comprise at least one mating plug connector 22 which can be arranged and attached to the first printed circuit board 25 in such a way that a plug-in axis 23 is inclined or tilted relative to a main plane in which the first printed circuit board 25 is formed. Via the mating plug connector 22 of the interface electronics, the latter are connected to one of the printed circuit boards of the electronic circuit via a corresponding connector 15*e* that is provided there. Plug connectors and mating plug connectors can be designed both as rigid and as flexible connectors. Plug and mating connectors can also be interchanged. Furthermore, electronic components for EMC and/or explosion protection measures 24 can be applied to the first printed circuit board 25.

The electronic circuit 15 located in the field device 10 can be at least partially arranged in an electronics cup 16, which has a secure fit in the field device housing and, if necessary, also serves to fix the printed circuit boards of the electronic circuit. The electronics cup 16 is thereby substantially adapted to an outer contour of the field device housing. Furthermore, the electronic circuit parts located in the electronics cup 16 can be cast by means of a potting compound 27.

The field device housing 12 also has a housing opening 18 through which the field contact plug is guided to the outside. For mechanical fixation and/or alignment or positioning, a precisely fitting plug sleeve is pushed over the field contact plug and attached in or on the field device housing. The plug sleeve 26 is welded to the outside to the field device housing. In order to fix the plug sleeve during the welding process, it can be fastened to the electronics cup 16 by means of a fastening device. This can take place, for example, via a latching mechanism on the electronics cup 16 arranged in the field device housing. For example, a first fastening element can be realized by a latching geometry molded onto the electronics cup 16—for example, in the form of a latching lug. In order to enable snapping or clipping in, a circumferential groove is implemented, on the plug sleeve 26, as a second fastening element. The interaction of the two fastening elements prevents the field contact plug from being influenced during the welding process, e.g., by the dynamics of the welding system or the influence of protective gas flows, since the plug sleeve 26 is fixed to the electronics cup 16. Furthermore, a laser beam has free access to the welding point.

At an upper end of the field device 10, the field device housing 12 has a control and/or display element for display and/or control 19. The control and/or display element 19 can, for example, be a display for visualizing information. For control, the control and/or display element 19 can also have capacitive buttons. These can be implemented, for example, by a corresponding capacitive film. It is also possible for the control and/or display element 19 to have only one or more LED's, via which a status of or other information about the field device is signaled.

Figure 2:
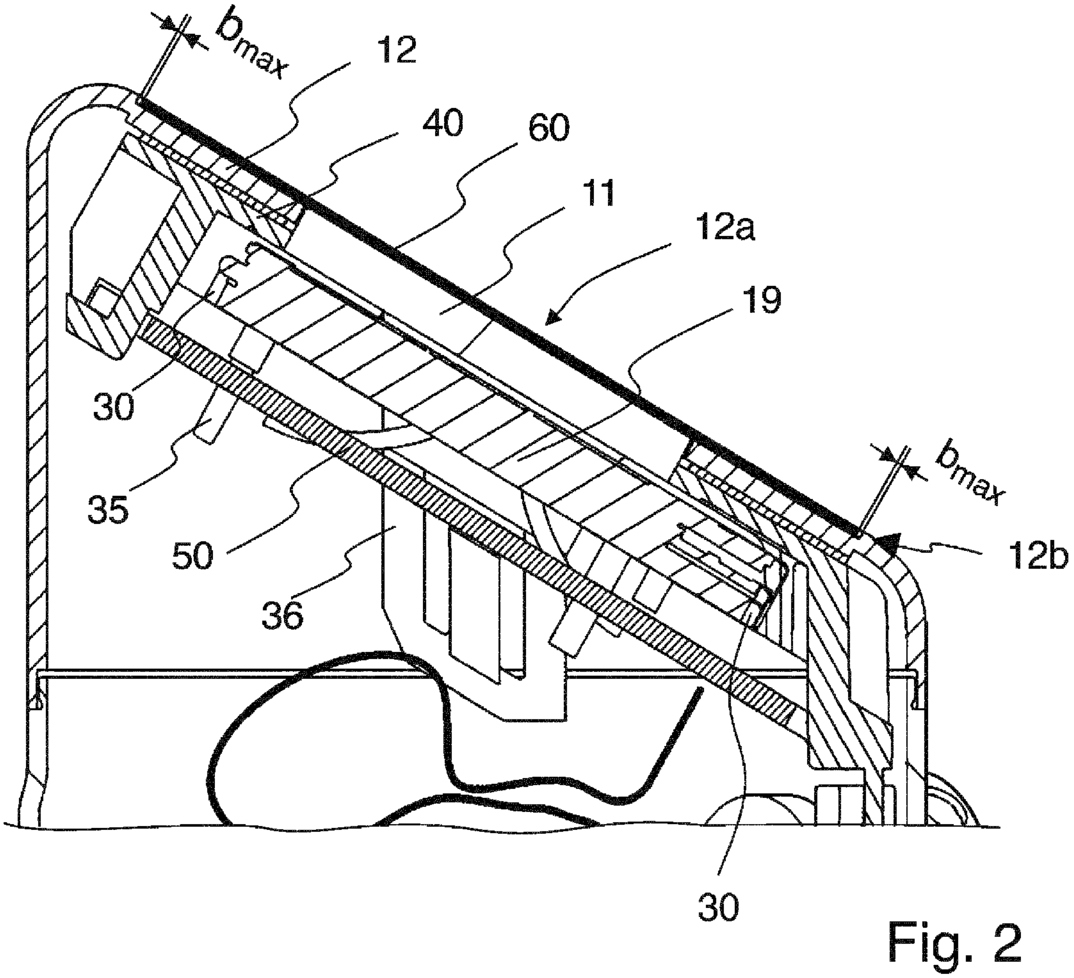
FIG. 2 shows a detail view of the area of the field device housing in which the control and/or display element is located behind a front film.

In order to meet the requirements of protection class IPx9, the control and/or display element 19 is arranged behind a front film 60 introduced into a recess in the field device housing. Such front films 60 are now used in almost all industrial sectors. These front films 60 are generally produced from polyester films or polycarbonate films. According to the invention, the front film 60 is arranged in an integrated recess 12*a* correspondingly provided on the field device housing 12. FIG. 2 shows in detail the area of the field device housing 12 in which the control and/or display element 19 is arranged. The front film 60 can here be designed as a self-adhesive film. Furthermore, the front film 60 can be printed on the rear side, so that the printing is protected from dust, moisture, chemical influences, scratches, heat, cold, and wear and tear caused by transport or continuous use.

With regard to the integrated recess 12*a*, it is designed in such a way that the housing 12 has a continuous contour as a recessed pocket for accommodating the front film 60. The integrated recess 12*a* can be made, for example, by means of an embossing die during the manufacture of the housing 12. The integrated recess 12*a* is also designed in such a way that a circumferential gap 12*b* necessary for assembly is present or results. This means that the recess is designed to be slightly higher and/or wider than a height and/or width of the front film 60 to be placed into the recess. Ideally, the gap has a maximum width of 2 mm, in particular a maximum of 0.15 mm. Alternatively or additionally, the recess can also be designed in such a way that a depth of the recess corresponds to at least one material thickness of the front film, so that it is ensured that a laterally applied high-pressure water or steam jet cannot assault the rear side of the front film. In order to protect the control and/or display element 19, which is otherwise protected only by the front film, from the high-pressure water or steam jet, it can be arranged behind a viewing or control panel 11 integrated into the housing 12 in the interior 13 of the field device.

In order to have the best possible representation or readability of the information on or from the control and/or display element, it may be necessary for the control and/or display element 19 to rest as flatly and/or evenly as possible against the rear side of the viewing or control panel 11. For this purpose, a display frame 30 can be used, which on the one hand accommodates the control and/or display element 19 and, on the other, places it behind the viewing or control panel 11. For this purpose, the display frame can be fastened to a carrier plate 50 appropriately positioned in the interior 13, so that the control and/or display element 19, which is arranged in an accommodating surface 37 and possibly fixed there, is pressed onto the viewing panel 11 by the display frame 30. The carrier plate can be a printed circuit board 50 that can be configured, for example, to enable the evaluation and/or actuation or control of the control and/or display element 19. The display frame 30 can thereby be axially aligned via the guide pins 35, which are inserted into corresponding bores on the printed circuit board 50. The display frame 30 is fastened via two latching hooks 36 which, for fixation, engage on a side, facing away from the display frame 30, of the printed circuit board 50.

In addition, the above-described display frame 30 together with the carrier plate or printed circuit board can be integrated into a display holder 40. The display holder 40 can preferably be designed in such a way that it also has its own latching elements, in particular in the form of latching hooks, with which it is also fastened to the carrier plate or printed circuit board 50. In this way, the display frame 30 forms a unit or an assembly with the control and/or display element 19, the printed circuit board 50, and the display holder 40. Furthermore, the display holder 30 may also feature the control or viewing panel 11.

The invention claimed is:

1. An IPx9-compatible automation field device comprising:

a front film;

a metallic field device housing that encloses an interior and includes an integrated recess for accommodating the front film, wherein the integrated recess is formed as a continuous contour on an outer side of the field device housing;

a control and/or display element arranged in an area of the recess in the interior of the field device housing;

wherein the front film is applied to the field device housing and is introduced into the recess integrated into the field device housing.

2. The IPx9-compatible automation field device according to claim 1, wherein the recess is designed such that a depth of the recess corresponds to at least one material thickness of the front film.

3. The IPx9-compatible automation field device according to claim 1, wherein the recess is designed and coordinated with the front film such that a circumferential gap is formed around the front film introduced into the recess.

4. The IPx9-compatible automation field device according to claim 3, wherein the circumferential gap has a maximum width of 0.2 mm.

5. The IPx9-compatible automation field device according to claim 3, wherein the circumferential gap has a maximum width of 0.15 mm.

6. The IPx9-compatible automation field device according to claim 1, wherein the recess is produced by means of an embossing die during the manufacture of the field device housing.

7. The IPx9-compatible automation field device according to claim 1, wherein the front film is printed on the rear side.

* * * * *